(12) United States Patent
Irie et al.

(10) Patent No.: US 6,958,487 B2
(45) Date of Patent: Oct. 25, 2005

(54) DEVICE FOR GENERATING A CONSTANT VOLTAGE AND METHOD FOR FABRICATING THE SAME

(75) Inventors: Akinobu Irie, Utsunomiya (JP); Ginichiro Oya, Utsunomiya (JP)

(73) Assignee: Utsunomiya University, Utsunomiya (JP)

(*) Notice: Subject to any disclaimer, the term of this patent is extended or adjusted under 35 U.S.C. 154(b) by 0 days.

(21) Appl. No.: 10/392,823

(22) Filed: Mar. 21, 2003

(65) Prior Publication Data

US 2003/0209706 A1 Nov. 13, 2003

(30) Foreign Application Priority Data

Mar. 26, 2002 (JP) .............................. 2002-085211

(51) Int. Cl.[7] .......................................... H01L 39/22
(52) U.S. Cl. .......................... 257/34; 257/30; 257/31; 505/190
(58) Field of Search ...................... 257/30–39; 505/190

(56) References Cited

U.S. PATENT DOCUMENTS

2001/0035524 A1 * 11/2001 Zehe .......................... 257/31

FOREIGN PATENT DOCUMENTS

| JP | 407235700 A | * | 9/1995 | ........... H01L 39/22 |
| JP | A 7-235700 | | 9/1995 | |

OTHER PUBLICATIONS

H.B. Wang et al., "Terhertz Responses of Intrinsic Josephson Junctions in High Tc Superconductors", Physical Review Letters, vol. 27, No. 10, Sep. 3, 2001, pp. 107002-1-4.

* cited by examiner

Primary Examiner—Minhloan Tran
Assistant Examiner—Johannes Mondt
(74) Attorney, Agent, or Firm—Oliff & Berridge, PLC

(57) ABSTRACT

A mesa-shaped superconducting-superlattice structure is formed and adhered with epoxy onto a dielectric substrate where plural superconducting layers and plural insulating layers are naturally and alternately stacked. A $\lambda/4$ micro strip line (which means the length of the strip line is one-fourth of the wavelength of a microwave to be introduced) is electrically connected via a metallic film onto the mesa structural portion of the superconducting-superlattice structure, and a metallic electrode is electrically connected to the additional mesa structural portion of the superconducting-superlattice structure via a metallic film.

5 Claims, 5 Drawing Sheets

DEVICE FOR GENERATING A CONSTANT VOLTAGE AND METHOD FOR FABRICATING THE SAME

BACKGROUND OF THE INVENTION

1. Field of the Invention

This invention relates to a device for generating a constant voltage and a method for fabricating the device which are preferably usable for various electronic devices and precision electronic measuring instruments.

2. Description of the Prior Art

Conventionally, a primary voltage standard device has been employed which utilizes a Josephson device. The Josephson device consists of two superconductors, the superconductive electrons of which are interacted one another. As a typical Josephson device can be exemplified a tunnel junction element which is composed of a multilayered structure of superconductor/insulator/superconductor. The Josephson element can exhibit some constant voltage steps at the quantized voltage in the current-voltage characteristic to the ac Josephson effect when a microwave is applied. In this case, the constant voltage steps are determined primary on the frequency of the microwave, so the Josephson device can be utilized in the voltage standard device.

A Josephson element practically usable can be fabricated as follows. First of all, a multilayered structure of niobium thin film (~100 nm)/aluminum oxide thin film (~2 nm)/niobium thin film (~100 nm) is formed, and then, micro-processed. In this case, several ten thousand and more Josephson elements can be integrated. Practically, in the case of fabricating a voltage standard device of several metallic Josephson elements, thousand to ten thousand Josephson elements are connected in series to generate a standard voltage of several volts to several ten volts because one element can generate a voltage of about 1 mV.

As mentioned above, the fabricating technique of the conventional Josephson element using metallic superconductors and the constant voltage-generating technique are established and earn confidence. In the conventional Josephson voltage standard device, however, it is required to arrange several thousand to several ten thousand elements two-dimensionally, so that the arrangement area is increased and it becomes difficult to apply a microwave uniformly on all of the arranged elements. In this point of view, it is desired to decrease the arrangement area and thus, downsize the voltage-generating device itself.

SUMMARY OF THE INVENTION

It is an object of the present invention, in this point of view, to provide a compact constant voltage-generating device and a method for fabricating the device.

For achieving the above object, this invention relates to a device for generating a constant voltage comprising:
  a dielectric substrate,
  a mesa-shaped superconducting-superlattice structure where plural superconducting layers and plural insulating layers are naturally and alternately stacked and which is formed on the dielectric substrate,
  a micro strip line for introducing a microwave which is formed so as to be electrically contacted to a top surface of a mesa structural portion of the superconducting-superlattice structure, and
  a metallic electrode for outputting voltages induced by the microwave so as to be electrically connected to at least one portion of the superconducting-superlattice structure.

The inventors had intensely studied to achieve the above object. As a result, they found out that in the superconducting-superlattice structure where several superconductive layers and several insulating layers are naturally and alternately stacked, a multilayered structure of superconductive layer/insulating layer/superconductive layer functions as one Josephson element. In the superconducting-superlattice structure, therefore, plural multilayered structures as mentioned above are formed. Accordingly, the superconducting-superlattice structure functions as several thousand to several ten thousand Josephson elements which are connected in series.

Moreover, if the superconducting-superlattice structure is micro-processed in mesa-shape and thus, the top area of the mesa structure is reduced to a given area, a Josephson junction array can be realized because the critical current can be reduced when a micro strip line to introduce a microwave is formed on the top of the mesa structure.

Therefore, according to the present invention, the Josephson junction array can be fabricated of single superconducting-superlattice structure, and thus, the intended constant voltage-generating device can be reduced in size.

Herein, the term "naturally stack" does not mean an intentional stacking structure of superconductive layers and insulating layers by means of conventional film-forming technique, but means an inevitable stacking structure due to the crystal structure of the superconducting-superlattice structure.

This invention also relates to a method for fabricating a constant voltage-generating device, comprising the steps of:
  forming, on a dielectric substrate, a superconducting-superlattice structure where plural superconducting layers and plural insulating layers are naturally and alternately stacked,
  patterning the superconducting-superlattice structure in mesa shape through photolithography technique,
  forming a micro strip line for introducing a microwave so as to be electrically contacted to a top surface of a mesa structural portion of the superconducting-superlattice structure, and
  forming a metallic electrode for outputting voltages induced by the microwave so as to be electrically connected to at least one portion of the superconducting-superlattice structure.

According to the fabricating method of the present invention, since it is not required to arrange many Josephson elements two-dimensionally, the intended constant voltage-generating device can be easily provided.

Details and other advantages of the invention and the fabricating method of the constant voltage-generating device will become apparent from the following description of embodiments with reference to the accompanying drawings.

BRIEF DESCRIPTION OF THE DRAWINGS

For better understanding of the present invention, reference is made to the attached drawings, wherein.

DESCRIPTION OF THE PREFERRED EMBODIMENTS

Figure 1:
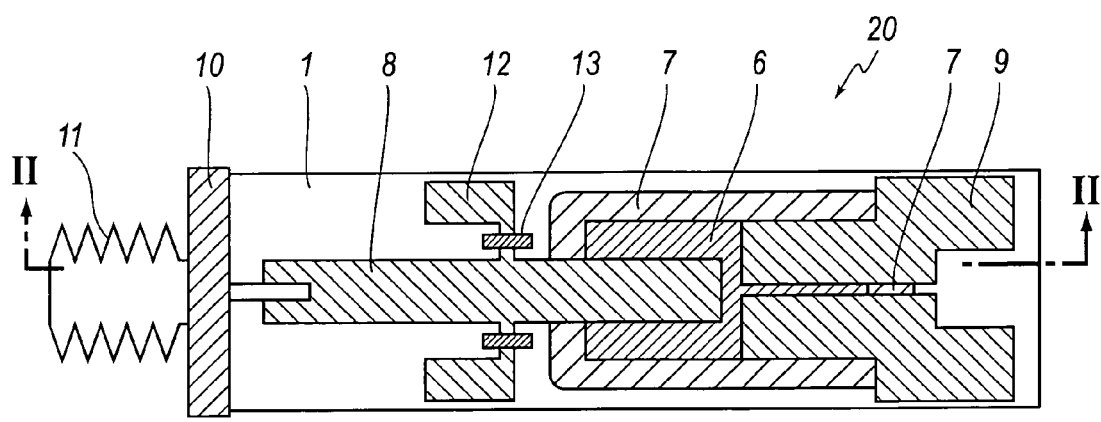
FIG. 1 is a plan view showing a device for generating a constant voltage according to the present invention.
Figure 2:
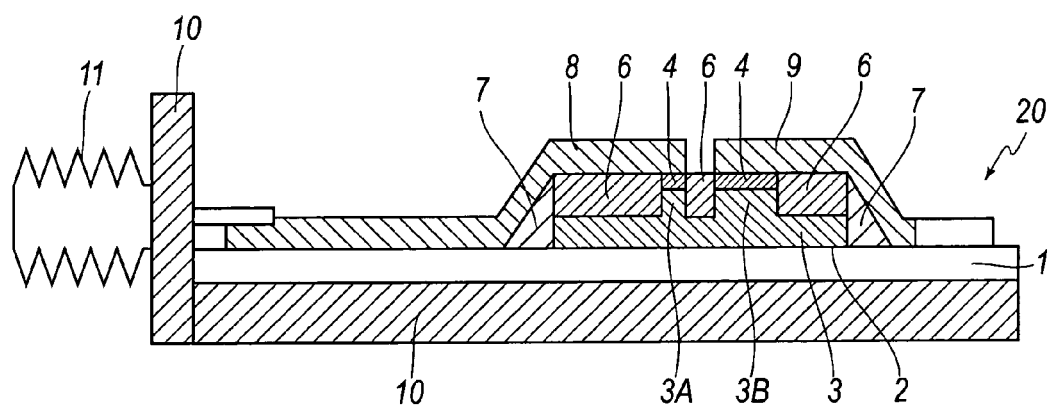
FIG. 2 is a cross sectional view of the generating device shown in FIG. 1, along the long direction across the center.

This invention will be described in detail with reference to the accompanying drawings. FIG. 1 is a plan view showing a device for generating a constant voltage according to the present invention, and FIG. 2 is a cross sectional view of the generating device shown in FIG. 1, along the long direction across the center. In the constant voltage-generating device 20 illustrated in FIGS. 1 and 2, a mesa-shaped superconducting-superlattice structure 3 is formed and adhered with an epoxy 2 onto a dielectric substrate 1. A $\lambda/4$ micro strip line (which means the length of the strip line is one-fourth of the wavelength of a microwave to be introduced) is electrically connected via a metallic film 4 onto the mesa structural portion 3A of the superconducting-superlattice structure 3, and the mesa structural portion 3B is connected to a metallic electrode 9 via the metallic film 4.

As mentioned above, the superlattice structure 3 is required to have a natural stacking structure composed of superconducting layers and insulating layers alternately stacked. In this case, the superlattice structure 3 constitutes a Josephson junction array, and thus, functions by itself as many Josephson elements. Therefore, it is not required to form a two-dimensional array, so that the intended generating device can be reduced in size. The superconducting-superlattice structure 3 can be made of a copper oxide-based high temperature superconductor. Concretely, the superlattice structure 3 can be made of a high temperature superconductor with a composition of $(Bi_{1-x}Pb_x)_2Sr_2Ca_{N-1}Cu_NO2_{N+\delta}$ ($0 \leq X \leq 0.5$, N=1–3) or $Tl_2Ba_2Ca_{N-1}Cu_NO_{2N+4}$ (N=1–3).

Figure 3:
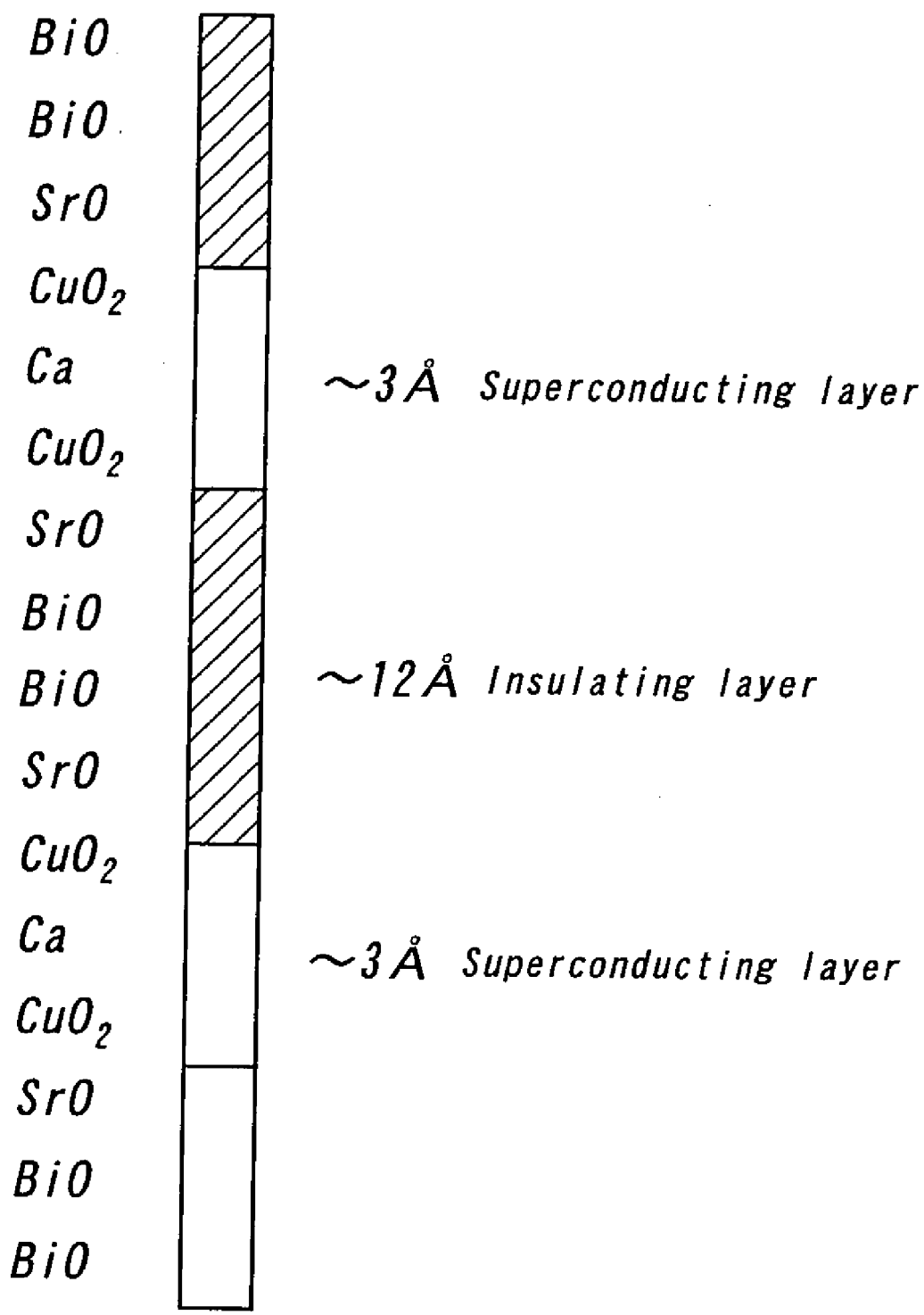
FIG. 3 is a conceptual view showing the crystal structure of $Bi_2Sr_2CaCu_2Oy$ single crystal.

FIG. 3 is a conceptual view showing the crystal structure of $Bi_2Sr_2CaCu_2Oy$ single crystal. In this case, the superconducting layer is composed of $CuO_2$—Ca—$CuO_2$ bond unit, and the insulating layer is composed of SrO—BiO—BiO—SrO bond unit. As shown in FIG. 3, since the superlattice structure 3 is composed of the alternately stacking structure of the superconducting layers and the insulating layers, the superlattice structure 3 functions by itself as many Josephson elements which are connected in series. Therefore, the superlattice structure 3 can constitute a Josephson array by itself.

Herein the superconducting transition temperature of the copper oxide-based high critical temperature superconductor is about 85K higher than the temperature of liquid nitrogen (77K). Therefore, the superconducting-superlattice structure 3, that is, the constant voltage-generating device 20 can be driven within a temperature range of liquid nitrogen. As a result, the generating device 20 can be easily driven. Conventionally, a Josephson element can not be realized within a temperature range of liquid nitrogen, and thus, such a Josephson element is desired for ever. In this point of view, the present invention is important.

The mesa structural portion 3A is electrically connected to the micro strip line 8 to constitute a Josephson array. In this case, in order to reduce the critical current of the connection, the top area of the connection of the portion 3A must be reduced. Concretely, the top area is preferably set to $100 \mu m^2$ or below. In this case, the critical current of the connection can be reduced sufficiently to form the Josephson array easily.

Although the lower limited value of the top area is not restricted, it is preferably set to 5 $\mu m^2$ in view of the processing technique and the processing precision at present.

The mesa structural portions 3A and 3B are embedded in an insulating layer 6 provided the micro strip line 8; the metallic electrode 9 and the superconducting-superlattice structure 3. In this case, the micro strip line 8 and the metallic electrode 9 can not be contacted to other portions except the mesa structural portions 3A and 3B. In the constant voltage-generating device 20, therefore, unnecessary short circuit can be prevented. The insulating layer 6 is made of e.g., SiO.

The side edges of the superconducting-superlattice structure 3 are covered with an insulating members 7. Therefore, the edge portions of the superlattice structure 3 can not be electrically connected to the micro strip line 8 and the metallic electrode 9. In this case, too, the unnecessary short circuit can be prevented in the generating device 20. The insulating member 7 is made of e.g., epoxy.

A metallic ground plate 10 made of copper or the like is provided on the rear surface and the side end of the substrate 1, and a connector 11 for introducing a high frequency wave (microwave) is provided on the side of the plate 10. Moreover, an additional metallic plate 12 is provided via a high frequency filter 13.

Then, the process for generating a constant voltage utilizing the generating device shown in FIGS. 1 and 2 will be described hereinafter. First of all, a given microwave is introduced into the micro strip line 8 from a microwave oscillator (not shown) via the connector 11. In this case, the microwave is not introduced into a biasing current supply (not shown) by the filter 13.

The microwave is introduced into the superconducting-superlattice structure 3 from the micro strip line 8 to generate discontinuous voltages within a wide range on the frequency of the microwave followed by the equation:

$$Vn = n(h/2e)f \quad (1)$$

Herein, the reference "Vn" designates an induced voltage, and the reference "f" designates the frequency of the microwave. The reference "h" designates Planck constant and the reference "e" designates an electron charge. The reference "n" designates whole number, and means step number.

Then, the fabricating method of the constant voltage-generating device 20 shown in FIGS. 1 and 2 will be described. FIGS. 4–9 are cross sectional views showing the steps in the fabricating method.

Figure 4:
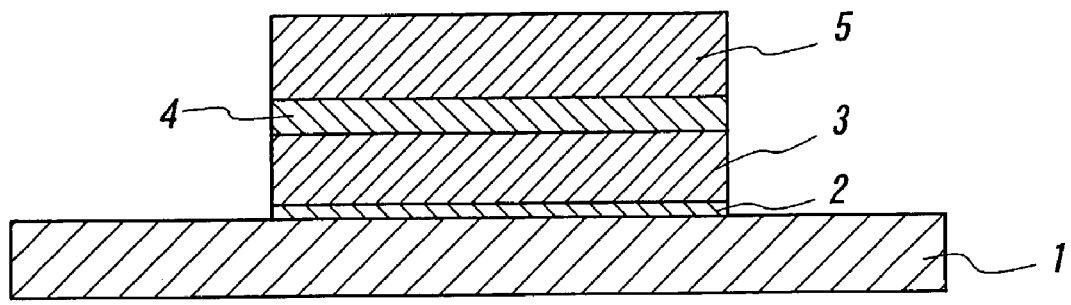
FIG. 4 is a cross sectional view showing one step in the method for fabricating the constant voltage-generating device according to the present invention.
Figure 5:
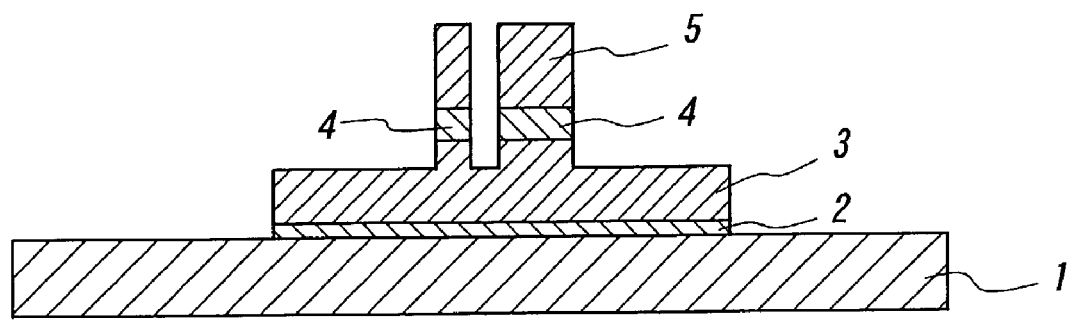
FIG. 5 is a cross sectional view showing the next step after the step shown in FIG. 4.

As shown in FIG. 4, first of all, the superconducting-superlattice structure 3 is formed and adhered onto the dielectric substrate 1 via the epoxy 2. Then, the surface portion of the superlattice structure 3 is cleaved and the metallic film 4 is formed, e.g., in a thickness of 50–100 nm by means of vacuum evaporation and sputtering. Then, a photoresist 5 is formed, e.g., in a thickness of 0.5 μm–1 μm on the metallic film 4 and dried to form the mesa structure as shown in FIG. 5 through photolithography.

Figure 6:
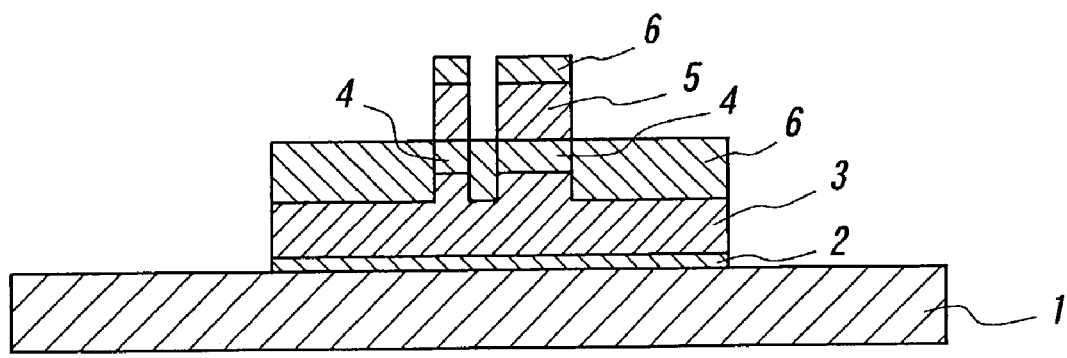
FIG. 6 is a cross sectional view showing the next step after the step shown in FIG. 5.
Figure 7:
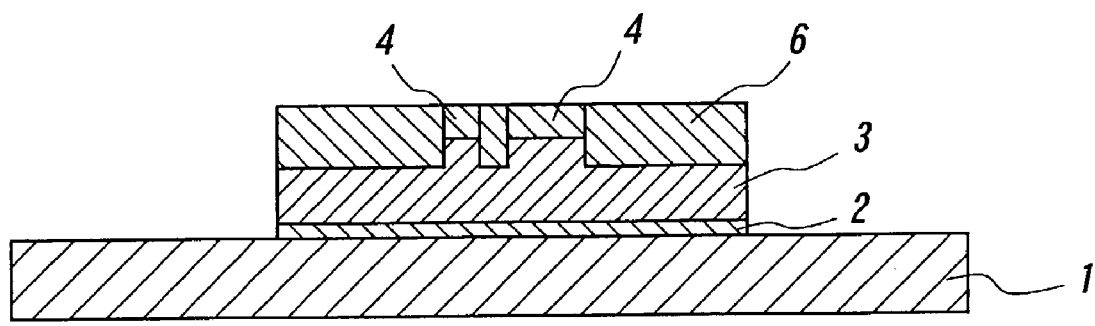
FIG. 7 is a cross sectional view showing the next step after the step shown in FIG. 6.

Then, the superlattice structure 3 and the metallic film 4 are etched by a given thickness, and as shown in FIG. 6, the insulating layer 6 is formed of SiO by means of vacuum evaporation and sputtering to flatten the processed region. Then, the obtained assembly is immersed in a solvent made of acetone or the like to lift off the photoresist 5 and the insulating layer 6.

Figure 8:
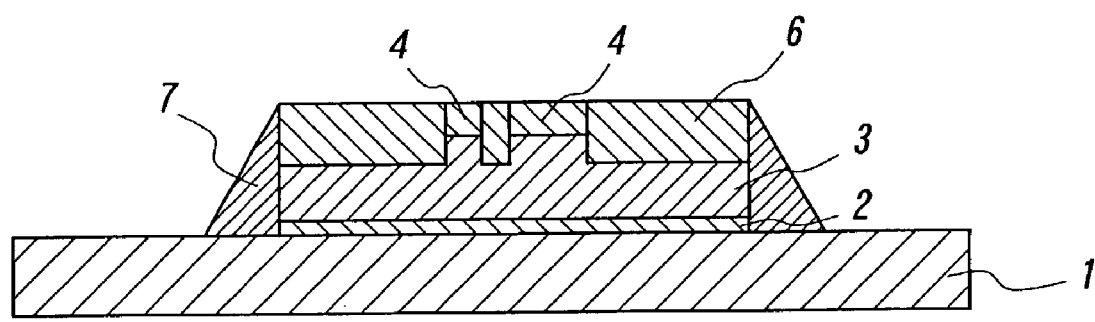
FIG. 8 is a cross sectional view showing the next step after the step shown in FIG. 7.
Figure 9:
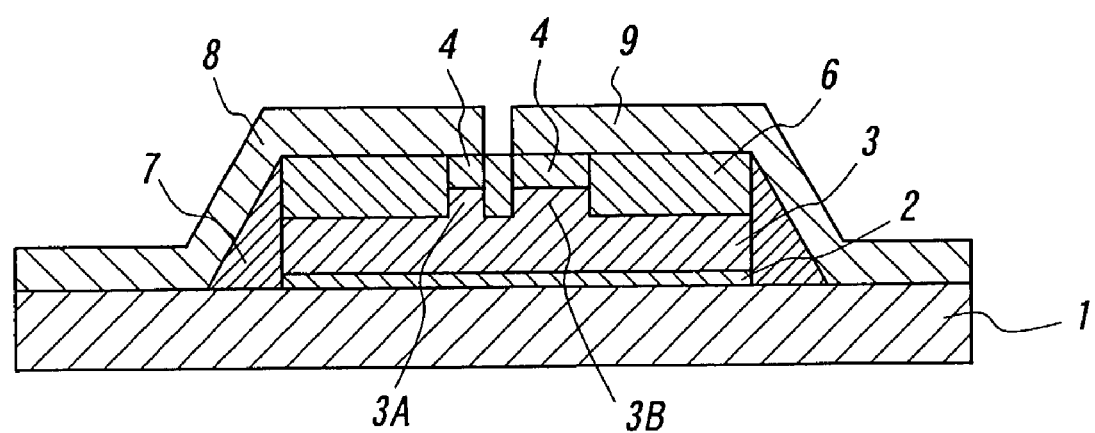
FIG. 9 is a cross sectional view showing the next step after the step shown in FIG. 8.

Then, as shown in FIG. 8, the epoxy (i.e., insulating members) 7 is applied so as to embed the steps between the superlattice structure 3 and the substrate 1. Then, a metallic film is formed in a thickness of 100–200 nm by means of vacuum evaporation and sputtering, and patterned by means of photolithography and ion etching to form the micro strip line 8 so as to be electrically connected to the mesa structural portion 3a of the superlattice structure 3 and the metallic electrode 9 so as to be electrically connected to the mesa structural portion 3B.

Then, the metallic ground plate 10 and the connector 11 are provided to form the constant voltage-generating device as shown in FIGS. 1 and 2.

EXAMPLE

The superconducting-superlattice structure 3 was made of $Bi_2Sr_2CaCu_2Oy$ single crystal, and the constant voltage-generating device shown in FIGS. 1 and 2 was fabricated in accordance with the steps illustrated in FIGS. 4–9. Then, a microwave with a frequency of 20 GHz was applied onto the micro strip line 8 at a temperature of 4.2K. By changing the microwave power, the current-voltage characteristic was provided as shown in FIG. 10.

Figure 10:
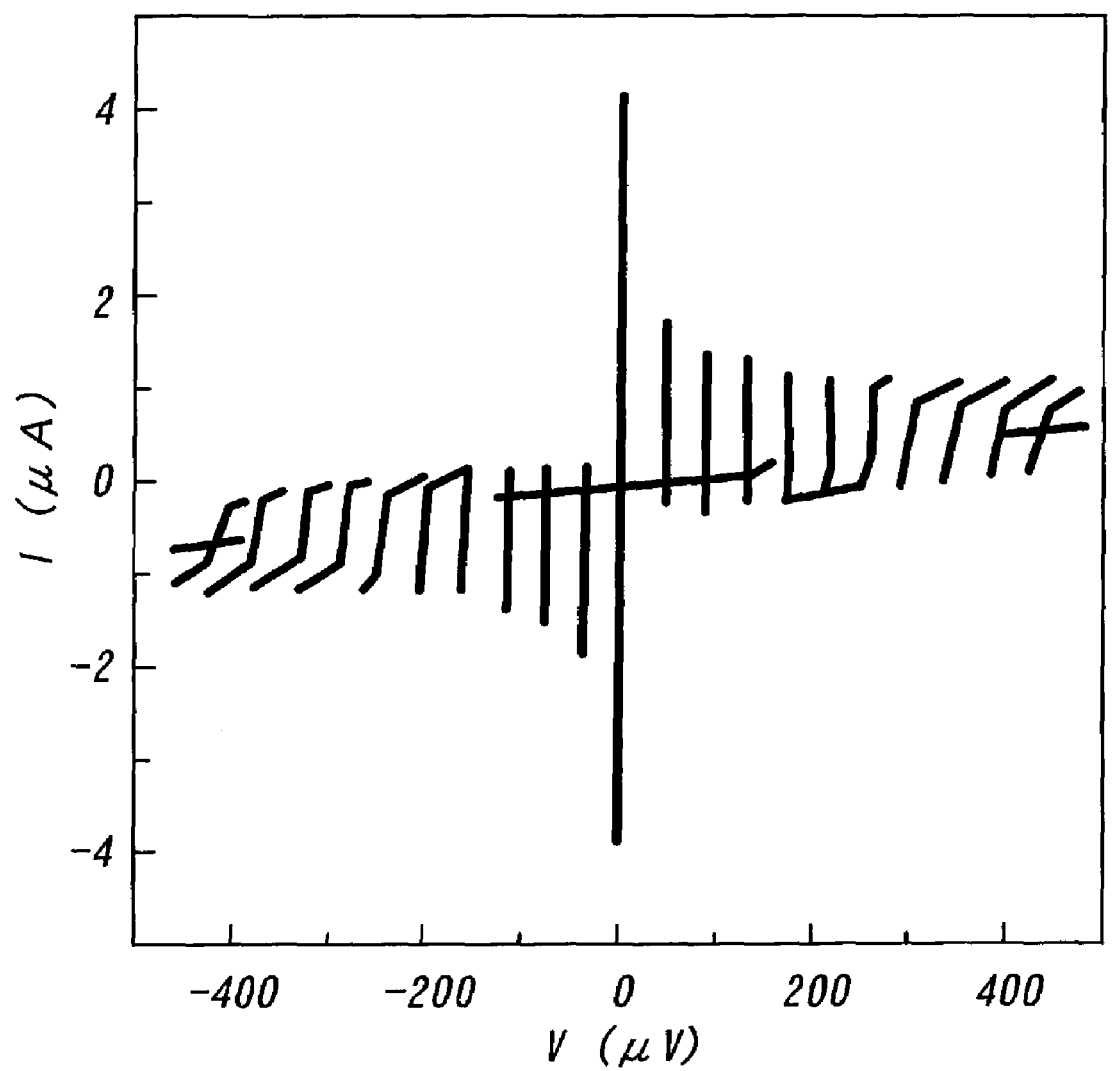
FIG. 10 is a graph showing the current-voltage characteristic of the constant voltage-generating device of the present invention.

It is apparent from FIG. 10 that voltages are generated discontinuously within a wide range so as to satisfy the equation (1). Therefore, it is confirmed that the superlattice structure 3 made of the $Bi_2Sr_2CaCu_2Oy$ single crystal constitutes a Josephson junction array.

Although the present invention was described in detail with reference to the above examples, this invention is not limited to the above disclosure and every kind of variation and modification may be made without departing from the scope of the present invention.

As mentioned above, according to the present invention, since a given Josephson junction array can be composed of single superconducting-superlattice structure without two-dimensional array, the intended constant voltage-generating device can be easily fabricated and reduced in size.

What is claimed is:

1. A device for generating a constant voltage comprising:
   a dielectric substrate,
   a mesa-shaped superconducting-superlattice structure where plural superconducting layers and plural insulating layers are naturally and alternately stacked and which is formed on said dielectric substrate,
   a micro strip line for introducing a microwave which is formed so as to be electrically contacted to a top surface of a mesa structural portion of said superconducting-superlattice structure, and
   a metallic electrode for outputting voltages induced by said microwave so as to be electrically connected to at least one portion of said superconducting-superlattice structure.
   wherein said mesa structural portion of said superconducting-superlattice structure is covered with an insulating layer and at least one side end of said superconducting-superlattice structure is covered with an insulating member, and a top surface of said mesa structural portion, a top surface of said insulating layer and a top surface of said insulating member are covered with at least one of said micro strip line and said metallic electrode.

2. The generating device as defined in claim 1, wherein the area of said top surface of said mesa structural portion of said superconducting-superlattice structure is set to 100 μm$^2$ or below.

3. The generating device as defined in claim 1, wherein said superconducting-superlattice structure includes an additional mesa structural portion in addition to said mesa structural portion, and said metallic electrode is electrically connected to a top surface of said additional mesa structural portion.

4. The generating device as defined in claim 1, wherein said superconducting-superlattice structure is made of a high temperature superconductor with a composition of $(Bi_{1-X}Pb_X)_2Sr_2Ca_{N-1}Cu_NO2_{N+\delta}(0 \leq X \leq 0.5, N=1–3)$ or $Tl_2Ba_2Ca_{N-1}Cu_NO_{2N+4}(N=1–3)$.

5. The generating device as defined in claim 1, further comprising a metallic ground plate provided on a rear surface of said dielectric substrate.

\* \* \* \* \*